US007843069B2

(12) United States Patent
Daubenspeck et al.

(10) Patent No.: US 7,843,069 B2
(45) Date of Patent: Nov. 30, 2010

(54) WIRE BOND PADS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 543 days.

(21) Appl. No.: 11/849,409

(22) Filed: Sep. 4, 2007

(65) Prior Publication Data

US 2009/0057908 A1 Mar. 5, 2009

Related U.S. Application Data

(62) Division of application No. 10/711,367, filed on Sep. 14, 2004, now Pat. No. 7,316,971.

(51) Int. Cl.
*H01L 23/49* (2006.01)
(52) U.S. Cl. .................. 257/773; 257/734; 257/774; 257/776; 257/779; 257/784; 257/786; 257/E23.019; 257/E23.02; 257/E23.142; 257/E23.143
(58) Field of Classification Search ............... 257/776, 257/786, E23.019, E23.02, 734, 773, 774, 257/779, E23.142, E23.143
See application file for complete search history.

(56) References Cited

U.S. PATENT DOCUMENTS

| 5,302,551 | A | 4/1994 | Iranmanesh et al. |
|---|---|---|---|
| 5,366,848 | A | 11/1994 | Thane et al. |
| 5,404,047 | A | 4/1995 | Rostoker et al. |
| 5,677,239 | A | 10/1997 | Isobe |
| 5,785,236 | A | 7/1998 | Cheung et al. |
| 5,844,317 | A * | 12/1998 | Bertolet et al. ............... 257/773 |
| 5,989,992 | A | 11/1999 | Yabu et al. |
| 6,054,389 | A | 4/2000 | Cheng |
| 6,500,750 | B1 | 12/2002 | Shroff et al. |
| 6,521,530 | B2 | 2/2003 | Peters et al. |
| 6,566,757 | B1 * | 5/2003 | Banerjee et al. .............. 257/758 |
| 6,580,168 | B2 | 6/2003 | Shen et al. |
| 6,746,898 | B2 * | 6/2004 | Lin et al. ..................... 438/113 |
| 6,952,051 | B1 | 10/2005 | Sandhu et al. |
| RE39,932 | E * | 12/2007 | Yabu et al. ................... 257/690 |
| 2002/0064929 | A1 * | 5/2002 | Bohr ........................... 438/612 |
| 2004/0121577 | A1 | 6/2004 | Yu et al. |
| 2005/0048755 | A1 | 3/2005 | Roche et al. |
| 2006/0065969 | A1 * | 3/2006 | Antol et al. .................. 257/700 |

* cited by examiner

*Primary Examiner*—Eugene Lee
*Assistant Examiner*—Peniel M Gumedzoe
(74) *Attorney, Agent, or Firm*—Schmeiser, Olsen & Watts; Anthony J. Canale

(57) ABSTRACT

A wire bond pad and method of fabricating the wire bond pad. The method including: providing a substrate; forming an electrically conductive layer on a top surface of the substrate; patterning the conductive layer into a plurality of wire bond pads spaced apart; and forming a protective dielectric layer on the top surface of the substrate in spaces between adjacent wire bond pads, top surfaces of the dielectric layer in the spaces coplanar with coplanar top surfaces of the wire bond pads.

20 Claims, 8 Drawing Sheets

US 7,843,069 B2

WIRE BOND PADS

RELATED APPLICATIONS

This application is a division of U.S. patent application Ser. No. 10/711,367 filed on Sep. 14, 2004, now U.S. Pat. No. 7,316,971 issued Jan. 8, 2008.

FIELD OF THE INVENTION

The present invention relates to the field of integrated circuit chips; more specifically, it relates to input/output (I/O) and power bonding pads for integrated circuit chips and method of fabricating the bonding pads.

BACKGROUND OF THE INVENTION

Many types of integrated circuit chips utilize wire bonding as a means connecting the integrated circuit chip to the next higher level of packaging, for example, for the chip connecting to a module. Wire bonding requires wire bond pads be placed on the periphery of the integrated circuit chip. Since wire bond pads are exposed to the ambient environment, sealing the edges of the wire bond pads is a requirement. Otherwise early failures and reliability problems can occur.

As integrated circuit chips have become smaller, feature (such as interconnect wire widths and spacing) sizes have been reduced and input/output (I/O) pin density has increased to increase productivity, but wire bond pads have not decreased in size or pitch (the center to center spacing of adjacent wire bond pads) proportionally to the decrease in chip and feature sizes. The industry has turned to other I/O pad types such as solder bump that offer greater I/O density, though at a greater cost which reduces productivity.

Therefore, there is a need for a high-density wire bond pad structure that offers increased I/O count without sacrificing reliability or impacting productivity.

SUMMARY OF THE INVENTION

A first aspect of the present invention is a method, comprising: providing a substrate; forming an electrically conductive layer on a top surface of the substrate; patterning the conductive layer into a plurality of wire bond pads spaced apart; and forming a dielectric layer on the top surface of the substrate in spaces between adjacent wire bond pads, top surfaces of the dielectric layer in the spaces coplanar with coplanar top surfaces of the wire bond pads.

A second aspect of the present invention is a method, comprising: (a) providing a substrate; (b) forming a passivation layer on a top surface of the substrate; (c) forming an electrically conductive layer on a top surface of the passivation layer; (d) patterning the conductive layer into a plurality of wire bond pads spaced apart, top surfaces of the wire bond pads coplanar; and (e) forming a dielectric layer on the top surface of the passivation layer in spaces between adjacent wire bond pads and on the top surfaces of the wire bond pads, the dielectric layer filling the spaces; and (f) removing the dielectric layer from the top surface of the wire bond pads, the top surface of the dielectric layer in the spaces coplanar with the top surfaces of the wire bond pads.

A third aspect of the present invention is a structure, comprising: a substrate; a plurality of wire bond pads on a top surface of the substrate, the wire bond pads spaced apart; and a dielectric layer on the top surface of the substrate in spaces between adjacent wire bond pads, top surfaces of the wire bond pads recessed below top surfaces of the dielectric layer in the spaces.

A fourth aspect of the present invention is a structure, comprising: a substrate; a plurality of wire bond pads on a top surface of the substrate, the wire bond pads spaced apart; and a dielectric layer on the top surface of the substrate in spaces between adjacent wire bond pads, top surfaces of the wire bond pads recessed below top surfaces of the dielectric layer in the spaces.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
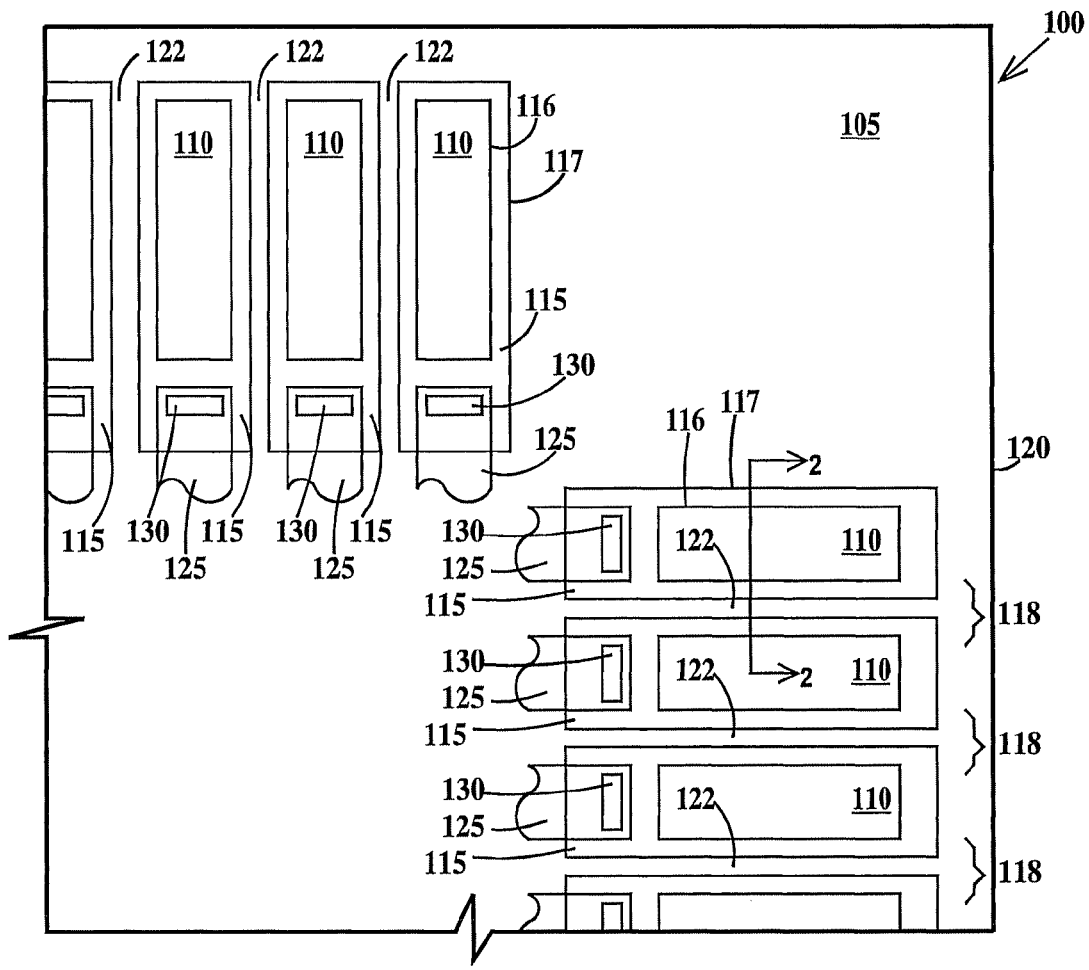
FIG. 1 a plan view of a corner portion of an exemplary integrated circuit chip utilizing related art wire bond pads.

FIG. 1 a plan view of a corner portion of an exemplary integrated circuit chip utilizing related art wire bond pads. In FIG. 1, an integrated circuit chip 100 has a terminal passivation layer 105 over a top surface of the integrated circuit chip. Openings 110 in terminal passivation layer 105 expose the top surface of wire bond pads 115. A periphery 116 of each opening 110 is contained within a periphery 117 of a corresponding wire bond pad 115. There is a web 118 of terminal passivation layer 105 between adjacent wire bond pads 115. Wire bond pads 115 are arranged along a periphery 120 of integrated circuit chip 100 and separated by spaces 122. Wire bond pads 115 are electrically connected to electrically conductive wires 125 within integrated circuit chip 100 through vias 130.

Figure 2:
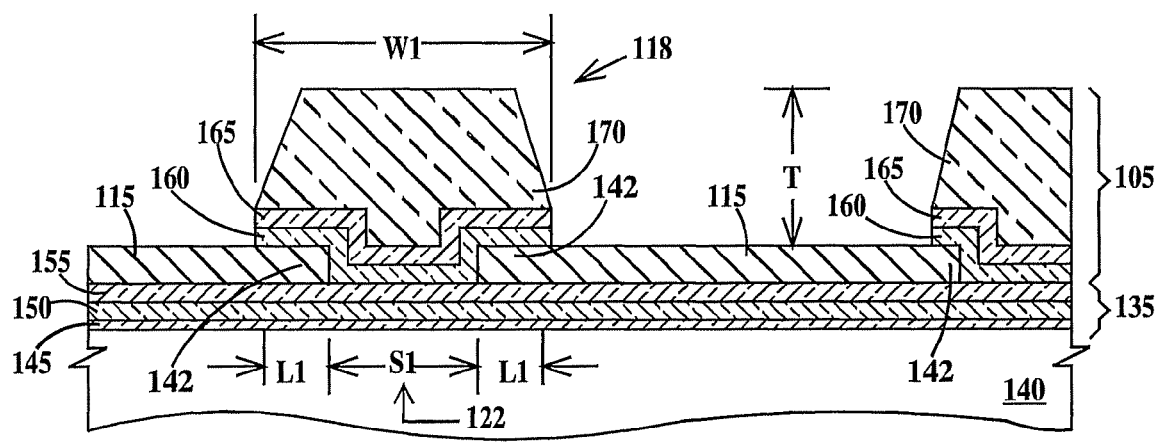
FIG. 2 is a partial cross-sectional view through line 2-2 of FIG. 1.

FIG. 2 is a partial cross-sectional view through line 2-2 of FIG. 1. In FIG. 2, wire bond pads 115 are formed on a final passivation layer 135 on a substrate 140 (which includes wires 125 (see FIG. 1), additional wires and devices such as transistors and capacitors that form the circuit of integrated circuit chip 100. Terminal passivation layer 105 overlaps edge regions 142 of wire bond pads 115. Final passivation layer 135 includes, in the present example, a first dielectric layer 145 on top of substrate 140, a second dielectric layer 150 on top of first dielectric layer 145 and a third dielectric layer 155 on top of second dielectric layer 150. Terminal passivation layer 105 includes, in the present example, a first dielectric layer 160 on top of edges 142 of wire bond pads 115 and final passivation layer 135, a second dielectric layer 165 on top of first dielectric layer 160 and a third dielectric layer 170 on top of second dielectric layer 165.

Adjacent wire bond pads 115 are separated by space 122 having a width S1. Terminal passivation layer 105, between adjacent wire bond pads 115 has a width W1 and a thickness T. Dielectric layer 165 comprises a photosensitive polyimide and dielectric layer 165 is about 12 microns thick. Thick polyimide is required to ensure good sealing of the integrated chip from ambient environment, but also limits the minimum printable image size. For example, with about a 12 micron thick polyimide, the minimum value for W1 is about 8 microns. There is a further minimum overlap distance of terminal passivation layer 105 and wire bond pads 115 of L1=about 3 microns. Together the W1 and L1 requirements result in a minimum value for S1 of about 2 microns.

The present invention results in wire bond pads that may be spaced closer together than heretofore possible.

Figure 3:
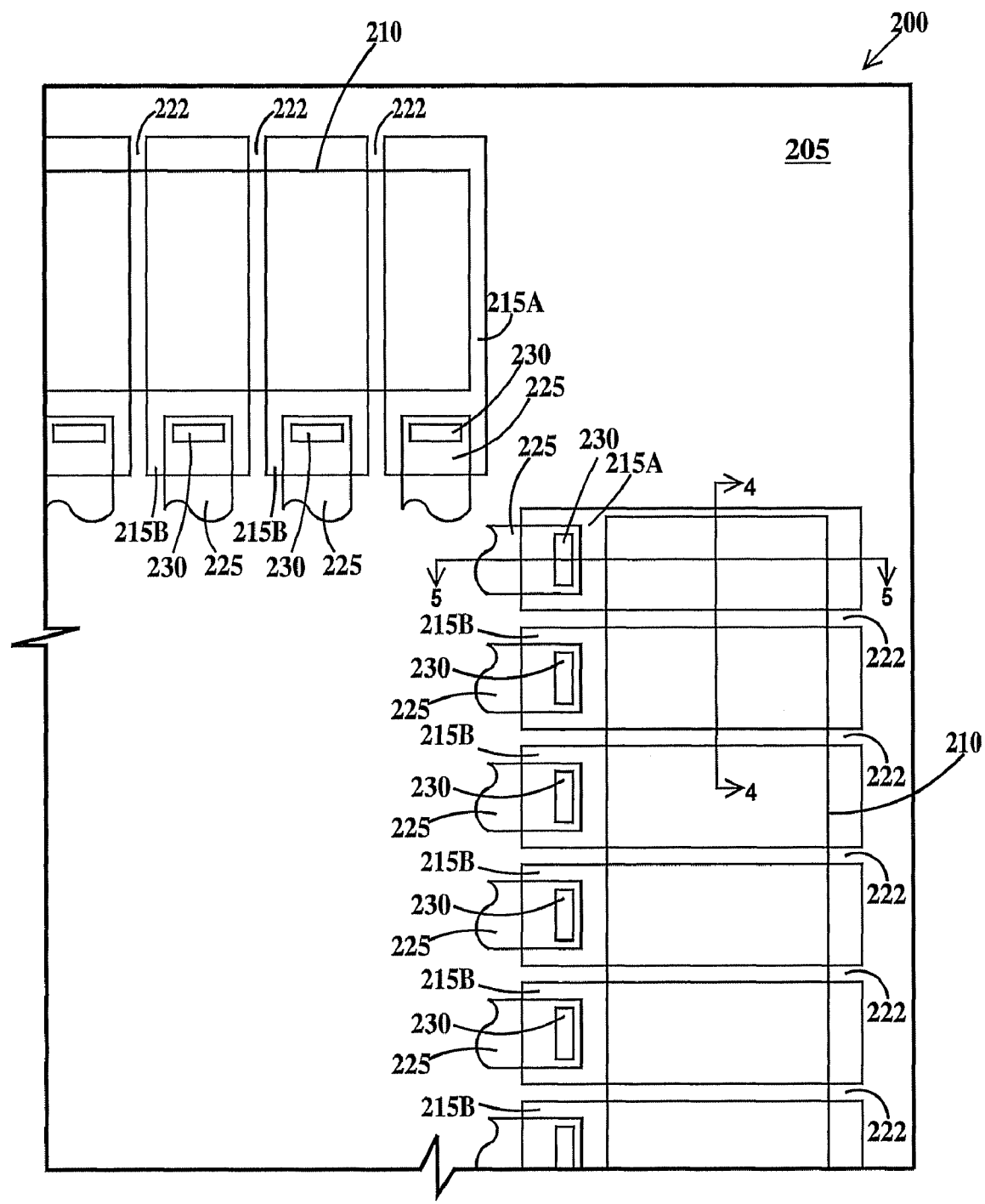
FIG. 3 a plan view of an integrated circuit chip utilizing wire bond pads according to a first embodiment of the present invention.

FIG. 3 a plan view of an integrated circuit chip utilizing wire bond pads according to a first embodiment of the present invention. In FIG. 3, an integrated circuit chip 200 has a terminal passivation layer 205 over a top surface of the integrated circuit chip. Openings 210 in terminal passivation layer 205 expose the top surface of wire bond pads 215. Openings 210 extend across adjacent wire bond pads 210 and there is no "web" as illustrated in FIG. 1 and described supra. Sets of wire bond pads, each set including outer wire bond pads 215A and inner wire bond pads 215B are arranged in rows along the periphery 220 of integrated circuit chip 200 and separated by spaces 222. Outer wire bond pads are defined as wire bond pads having an adjacent inner wire bond pad of the same row on only one side of the outer wire bond pad. Inner wire bond pads are defined as wire bond pads having adjacent inner or outer wire bond pads of the same row on both of opposing sides of the inner wire bond pad. Each outer and inner wire bond pads 215A and 215B are electrically connected to corresponding electrically conductive wires 225 within integrated circuit chip 200 through a corresponding via 230. While single rows of wire bond pads are illustrated in FIG. 3, there may be two or more rows of wire bond pads per side of integrated circuit chip 200.

Figure 4:
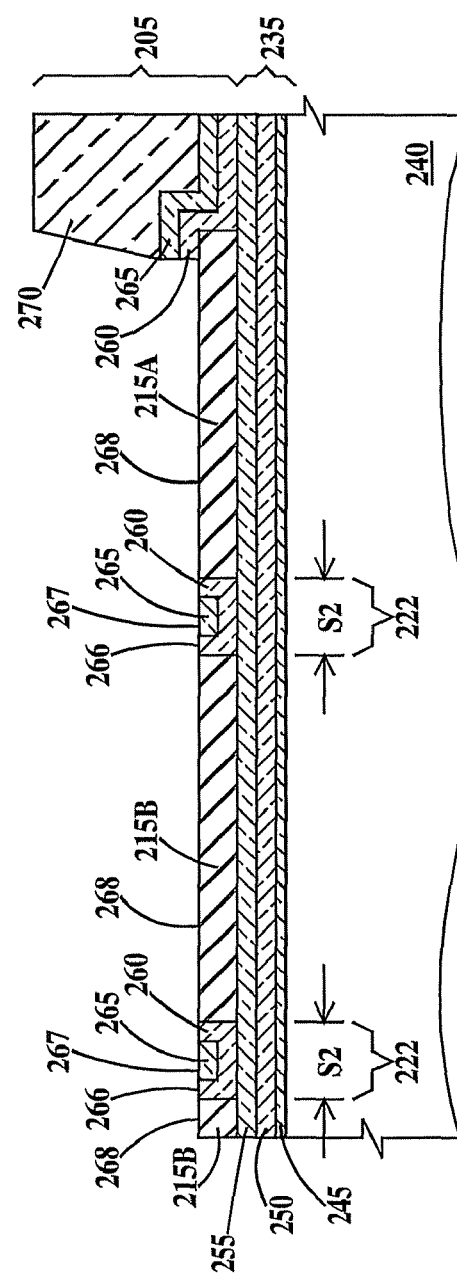
FIG. 4 is a partial cross-sectional view through line 4-4 of FIG. 3.

FIG. 4 is a partial cross-sectional view through line 4-4 of FIG. 3. In FIG. 4, outer wire bond pads 215A and inner wire bond pads 215B are formed on a final passivation layer 235 on substrate 240 (which includes wires 225 (see FIGS. 3 and 5), additional wires and devices such as transistors and capacitors that form the circuit of integrated circuit chip 200. Final passivation layer 235 includes, in the present example, a first dielectric layer 245 on top of substrate 240, a second dielectric layer 250 on top of first dielectric layer 245 and a third dielectric layer 255 on top of second dielectric layer 250. Final passivation layer 235 may include one layer, two layers, three layers as shown, or more layers. Materials and thicknesses for first dielectric layer 245, second dielectric layer 250 and third dielectric layer 255 are discussed infra.

In FIG. 4, terminal passivation layer 205 overlaps an edge region 242 of only outer wire bond pad 215A. Inner wire pads 215B are not overlapped by terminal passivation layer 205 in the section illustrated in FIG. 4. Outer wire bond pad 215A is separated from an adjacent inner wire bond pad 215B and adjacent inner wire bond pads 215B are separated from each other by spaces 222 having widths S2. However, between outer wire bond pad 215A and an adjacent inner wire bond pad 215B and between inner wire bond pads 215B, portions of first and second dielectric hard dielectric layers 260 and 265 fill up spaces 222. It should be understood, that wherever first and second dielectric hard dielectric layers 260 and 265 are indicated, they may be replaced with a single hard dielectric layer. Top surfaces 266 of first dielectric layer 260 and top surfaces 267 of second dielectric layer 265 are about coplanar with coplanar top surfaces 268 of outer and inner wire bond pads 215A and 215B.

The minimum value of space S2 is determined by the photolithography process used to pattern outer and inner wire bond pads 215A and 215B not by the photolithography process used to pattern the terminal passivation layer as is the case in FIG. 1. The wire bond pad photolithography process can print smaller images than the terminal passivation photolithography process because of the materials involved in the two processes and the minimum value of S2 thus may be significantly than that of S1. In one, example the minimum value of S2 is about 1 micron or less.

Given an example of a requirement to have a width of 40 microns of exposed wire bond pad, the wire bond array of FIG. 1 requires a 48 micron wire bond pitch (center to center spacing) when S1=2 microns and L1=3 microns, while the wire bond array of FIG. 3 requires a 41 micron wire bond pitch when S2=1 micron. This is a savings of about 15% in wire bond pitch.

Materials and thicknesses for first dielectric layer 260, second dielectric layer 265 and final dielectric layer 270 are discussed infra.

Figure 5:
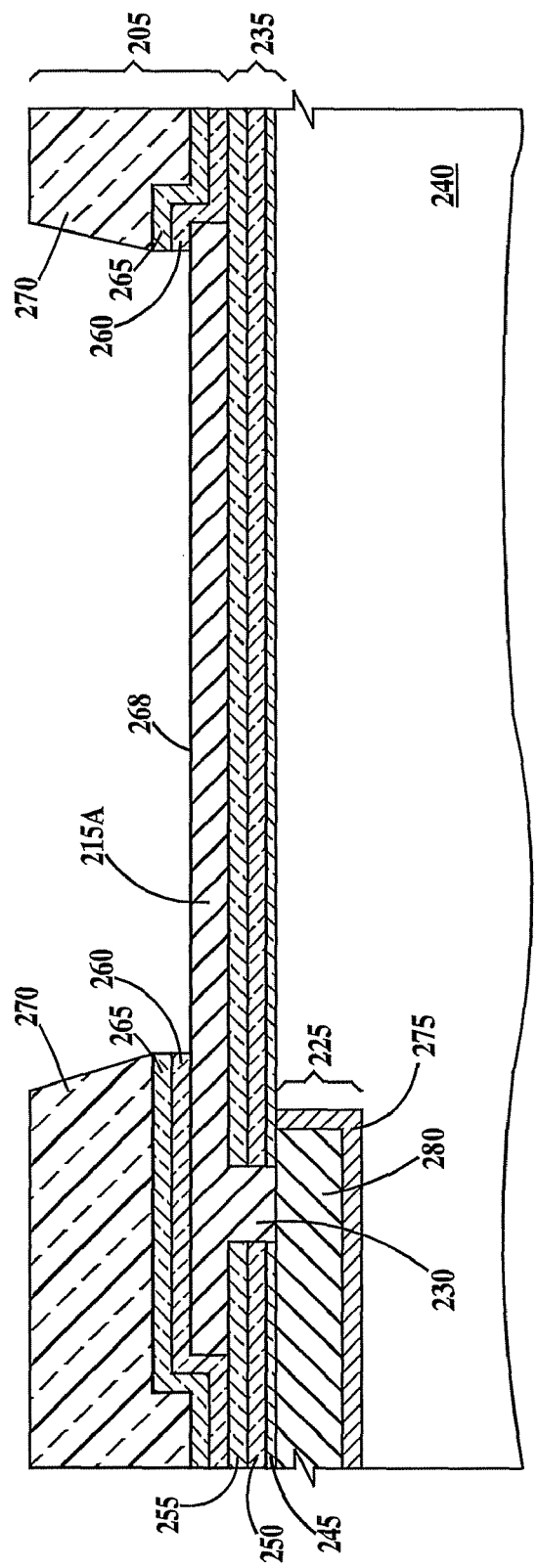
FIG. 5 is a partial cross-sectional view through line 5-5 of FIG. 3.

FIG. 5 is a partial cross-sectional view through line 5-5 of FIG. 3. In FIG. 5, via 230 is formed through passivation layer 235 and makes physical and electrical contact to wire 225. Wire 225 is illustrated as having a core conductor 280 and a conductive liner 275. In one example, core conductor 280 comprises copper and conductive liner 275 comprises layers of tantalum and tantalum nitride, the tantalum layer between the copper core and the tantalum nitride layer.

Figure 6A:
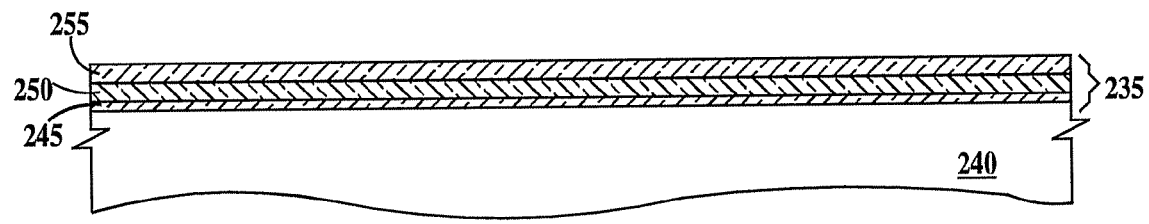
FIGS. 6A through 6J are partial cross-section views through line 4-4 of FIG. 3, illustrating fabrication of wire bond pads according to first, second and third embodiments of the present invention.

FIGS. 6A through 6J are partial cross-section views through line 4-4 of FIG. 3, illustrating fabrication of wire bond pads according to first, second and third embodiments of the present invention. In FIG. 6A, passivation layer 235 is formed on substrate 240. Passivation layer 235 comprises first dielectric layer 245, second dielectric layer 250 and third dielectric layer 255 as described supra. In one example, first dielectric layer 245 comprises silicon nitride, second dielectric layer 250 comprises silicon oxide and third dielectric layer 255 comprises silicon nitride.

Figure 6B:
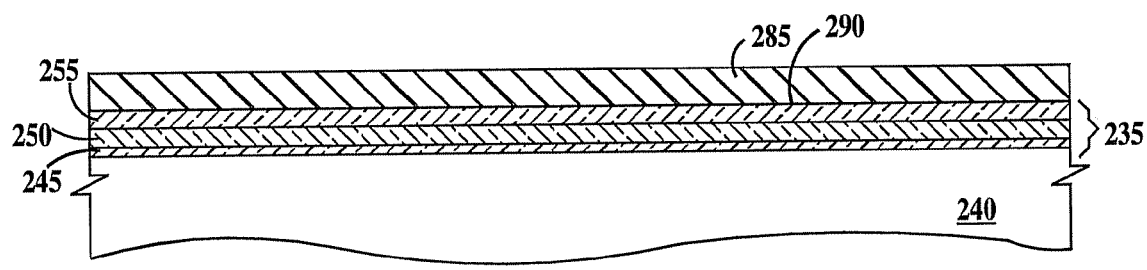

Between FIGS. 6A and 6B, vias 230 (see FIG. 5) not visible in section 4-4 are formed in passivation layer 235 by photolithographic and etch processes, including reactive ion etch (RIE), well known in the art.

In FIG. 6B an electrically conductive layer 285 is formed on a top surface of 290 of passivation layer 235. In one example, conductive layer 285 comprises, aluminum, aluminum copper alloy, a layer of aluminum covered by a layer of gold, copper, a layer of copper over a layer of tantalum, a layer of copper over layers of tantalum and tantalum nitride or combinations thereof. In one example, conductive layer 285 is about 0.5 microns to about 5 microns thick.

Figure 6C:
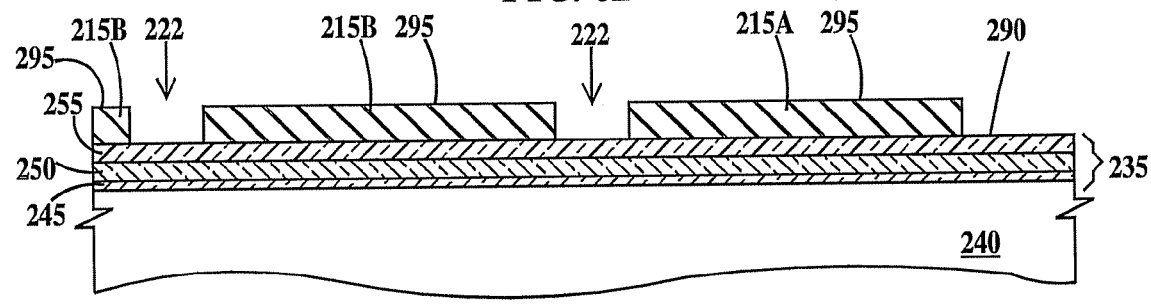

In FIG. 6C, a photolithographic process (depositing a photoresist layer, patterning the photoresist layer to expose portions of the underlying material, etching the underlying material, and removing the photoresist layer) is performed to form outer wire bond pad 215A and inner wire bond pads 215B separated by spaces 222. Because outer wire bond pad 215A and inner wire bond pads 215B are formed from the same conductive layer 285 (see FIG. 6B), top surfaces 295 of outer wire bond pad 215A and inner wire bond pads 215B are coplanar.

Figure 6D:
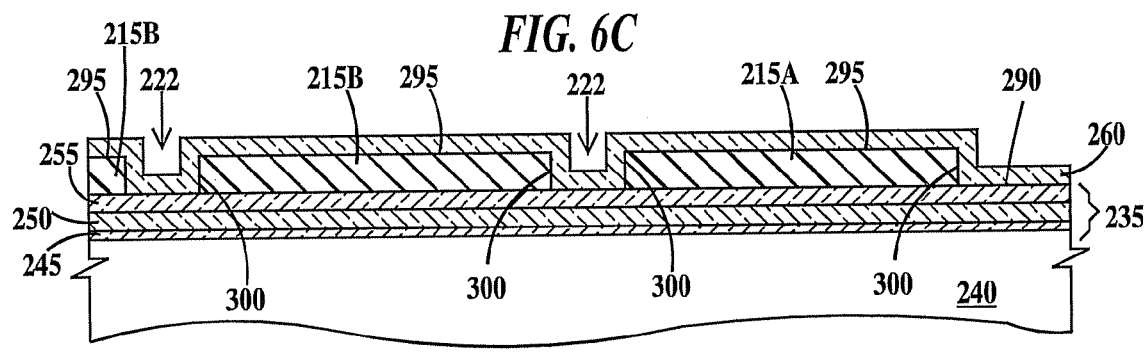

In FIG. 6D, first dielectric layer 260 is conformally deposited over top surfaces 295 of outer wire bond pad 215A and inner wire bond pads 215B and top surface 290 of passivation layer 235 as well as sidewalls 300 of outer wire bond pad 215A and inner wire bond pads 215B. Since a second dielectric layer 265 (see FIG. 6E) will be deposited in the next step, illustrated in FIG. 6E and described infra, first dielectric layer does not fill spaces 222 completely. However, if only one hard dielectric layer is used, then it is deposited with a sufficient thickness to fill spaces 222 to or above top surfaces 295 of outer wire bond pad 215A and inner wire bond pads 215B.

Figure 6E:
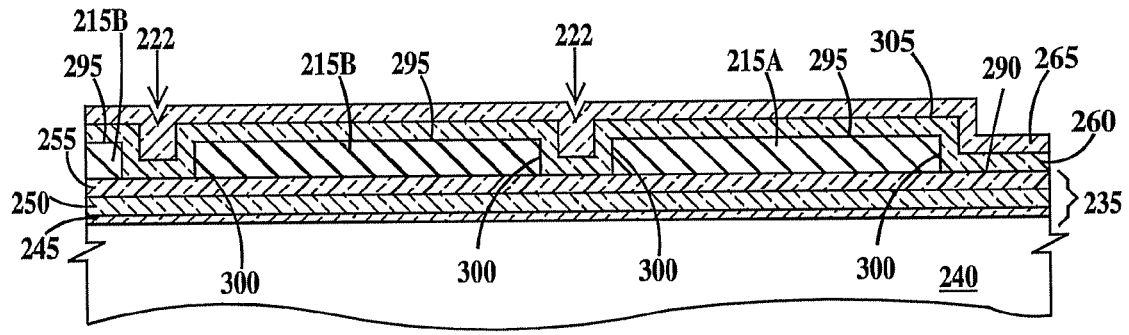

In FIG. 6E, second dielectric layer 265 is conformally deposited on a top surface 305 of first dielectric hard layer 260. In one example, first dielectric layer 260 comprises silicon oxide and second dielectric layer 265 comprises silicon nitride. The combined thicknesses of first and second dielectric layers 260 and 265 are chosen to fill spaces 222 to or above top surfaces 295 of outer wire bond pad 215A and inner wire bond pads 215B. The thickness of first dielectric layer 260 is chosen to be less than about half the width of spaces 222 (see FIG. 6B). The thickness of second dielectric layer 265 is chosen to be sufficient to fill any remaining region of spaces 222 to or above top surfaces 295 of outer wire bond pad 215A and inner wire bond pads 215B. For example, if the width of spaces 222 are about 1 micron sand the thickness of outer wire bond pad 215A and inner wire bond pads 215B is about 1.2 microns, then the total thickness of first and second dielectric layers 260 and 265 may be about 0.85 microns with one possible combination of thicknesses being about 0.45 microns of first dielectric layer 260 and about 0.4 microns of second dielectric layer 265.

Processing may continue to the processes and structures described in relation to FIG. 6F through 6J for the first, second and third embodiments of the present invention, or continue to the processes and structures described in relationship to FIG. 7A through 7D for the fourth, fifth and sixth embodiments of the present invention.

Figure 6F:
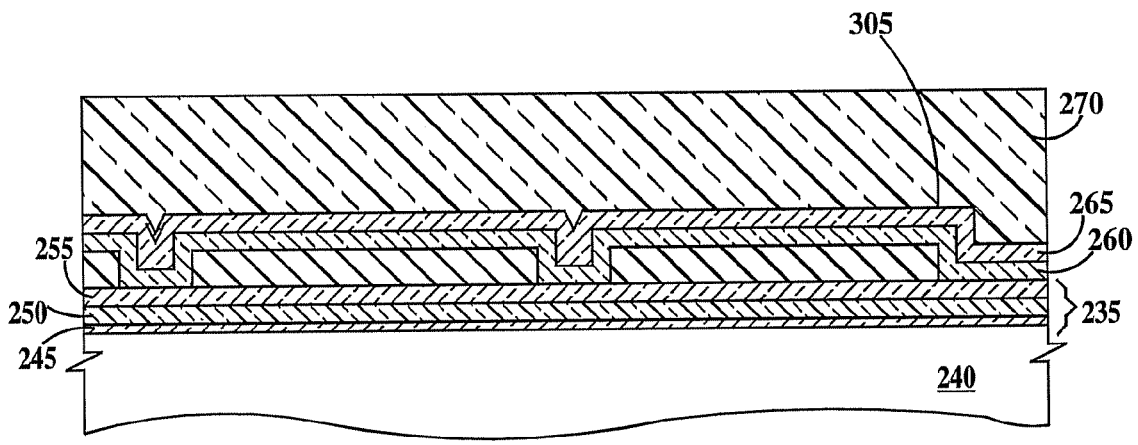

Continuing from FIG. 6E, in FIG. 6F, final dielectric layer 270 is applied to a top surface 310 of second dielectric layer 265. In one example, final dielectric layer 270 comprises photosensitive polyimide and is about 4 microns to about 20 microns thick. Photosensitive polyimide may be patterned directly, without the need to pattern a photo-resist layer first. In a second example, final dielectric layer 270 comprises polyimide and is about 4 microns to about 20 microns thick.

Figure 6G:
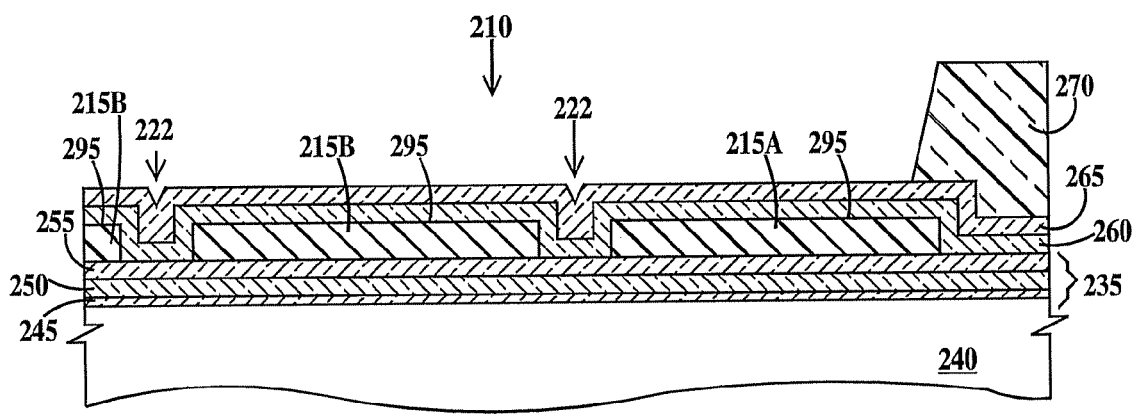

In FIG. 6G, third dielectric layer is patterned and opening 210 formed over outer wire bond pad 215A and inner wire bond pads 215B and now filled spaces 222. In the example of final dielectric layer 270 being photosensitive polyimide, the third dielectric layer is exposed to light through a mask and the third dielectric layer developed to form openings 210. In the example of final dielectric layer 270 being polyimide, a resist layer is applied over the third dielectric layer, the resist layer exposed to light through a mask, the resist layer developed, the third dielectric layer etched where not protected by the resist layer, and the resist layer removed.

Figure 6H:
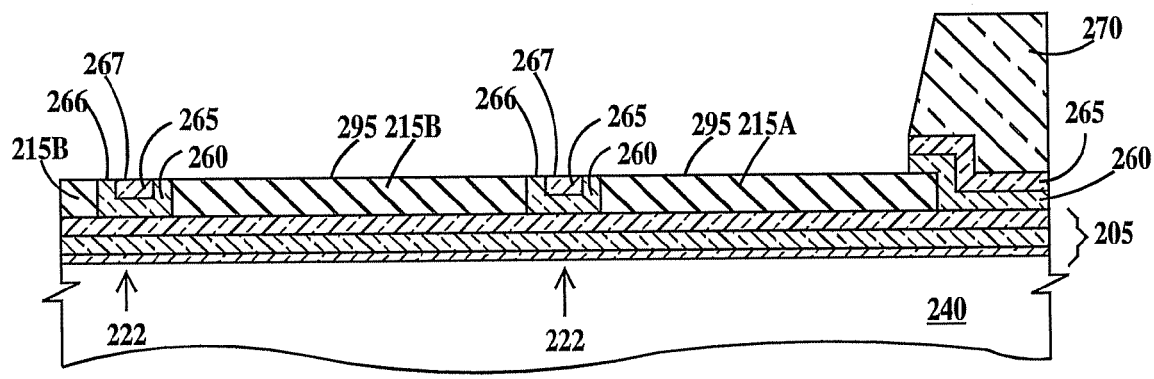

In FIG. 6H, an RIE process (for example using a fluorine containing gas) is performed to remove first and second dielectric layers 260 and 265 from top surfaces 295 of outer wire bond pad 215A and inner wire bond pads 215B that are not protected by final dielectric layer 270. However, between outer wire bond pad 215A and an adjacent inner wire bond pad 215B and between inner wire bond pads 215B, portions of first and second dielectric layers 260 and 265 remain, filling up spaces 222 so that top surfaces 266 of first dielectric layer 260 and top surfaces 267 of second dielectric layer 265 are about coplanar with coplanar top surfaces 295 of outer and inner wire bond pads 215A and 215B. The structure illustrated in FIG. 6H constitutes the first embodiment of the present invention. Processing may now terminate or processing may continue to the processes described in reference to either of FIG. 6I or FIG. 6J.

Figure 6I:
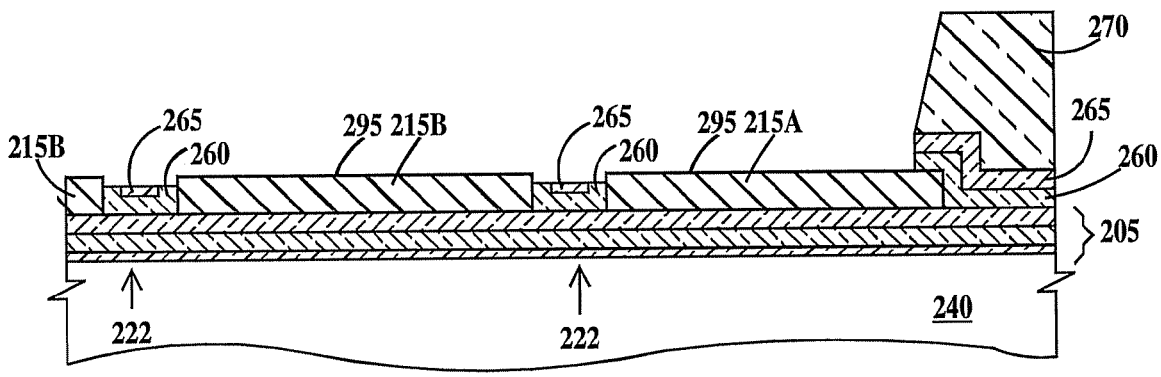

Continuing from FIG. 6H, in FIG. 6I, first and second dielectric layers 260 and 265 in spaces 222 are recessed below top surfaces 295 of outer and inner wire bond pads 215A and 215B. This may be accomplished by increasing the etch time of the etch described supra in reference to FIG. 6H, or by performing a second RIE process (for example using a fluorine containing gas). The structure illustrated in FIG. 6I constitutes the second embodiment of the present invention. Processing now terminates.

Figure 6J:
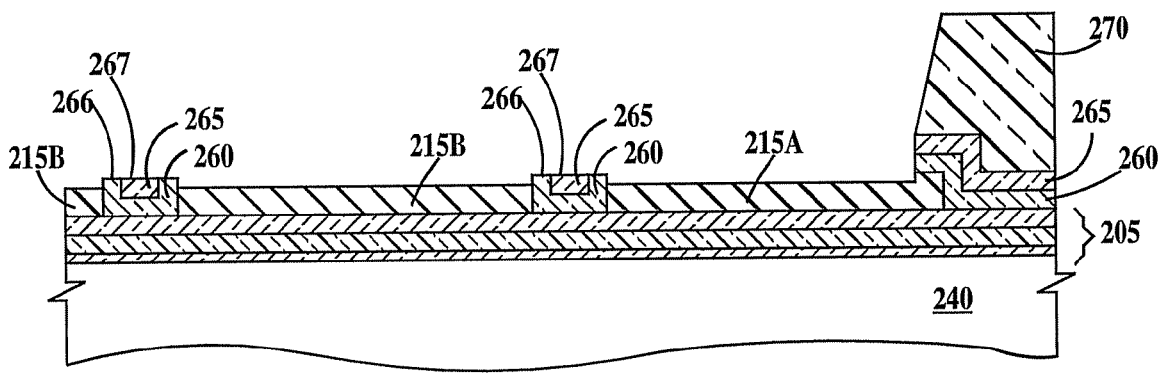

Continuing from FIG. 6H, in FIG. 6J, outer and inner wire bond pads 215A and 215B are recessed below top surfaces 266 of first dielectric layer 260 and top surfaces 267 of second dielectric layer 265 filling spaces 222. In the example that the wire bond pads comprise aluminum or aluminum alloy a RIE using a chlorine containing gas may be used. In the example that the wire bond pads comprise copper, an aqueous ammonium fluoride/hydrogen peroxide mixture may be used. The structure illustrated in FIG. 6J constitutes the third embodiment of the present invention. Processing now terminates.

Figure 7A:
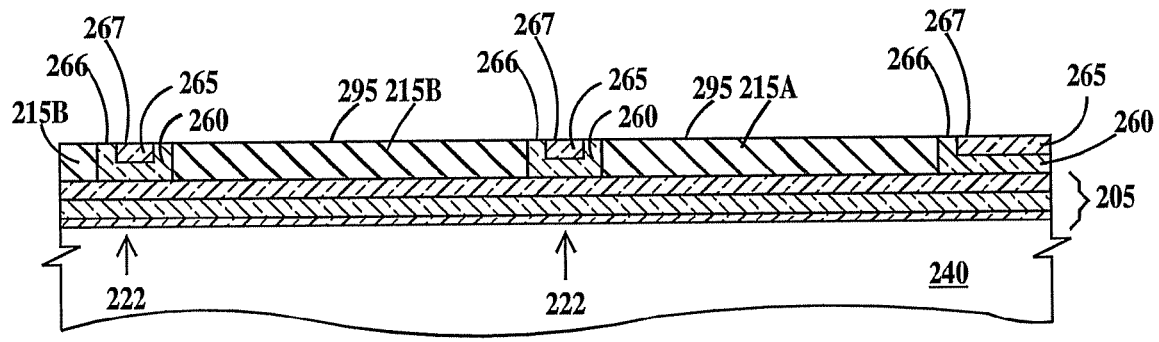
FIGS. 7A through 7E are partial cross-section views through line 4-4 of FIG. 3, illustrating fabrication of wire bond pads according to fourth, fifth and sixth embodiments of the present invention.
Figure 7B:
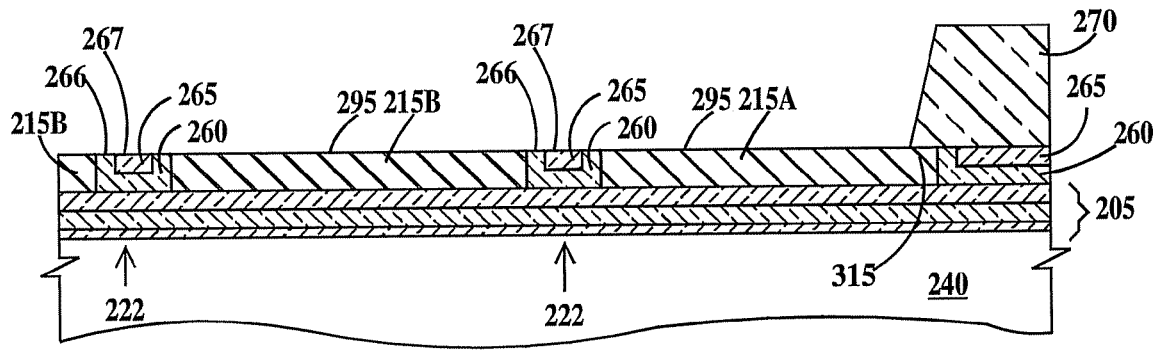
Figure 7C:
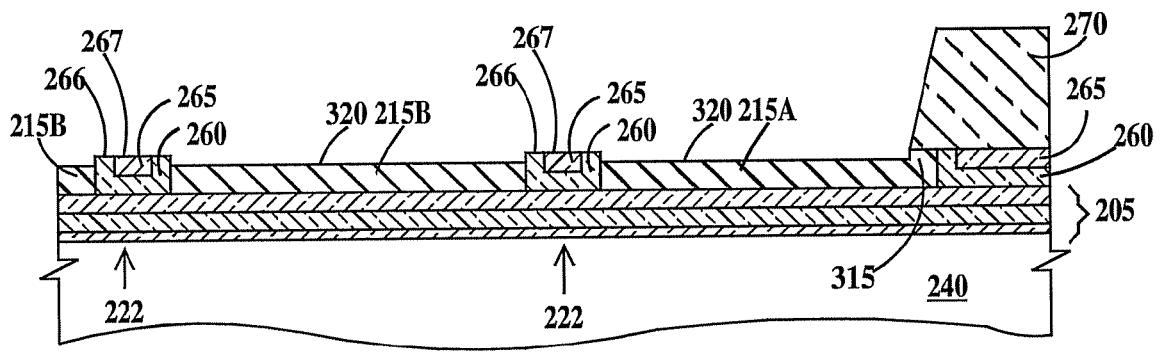
Figure 7D:
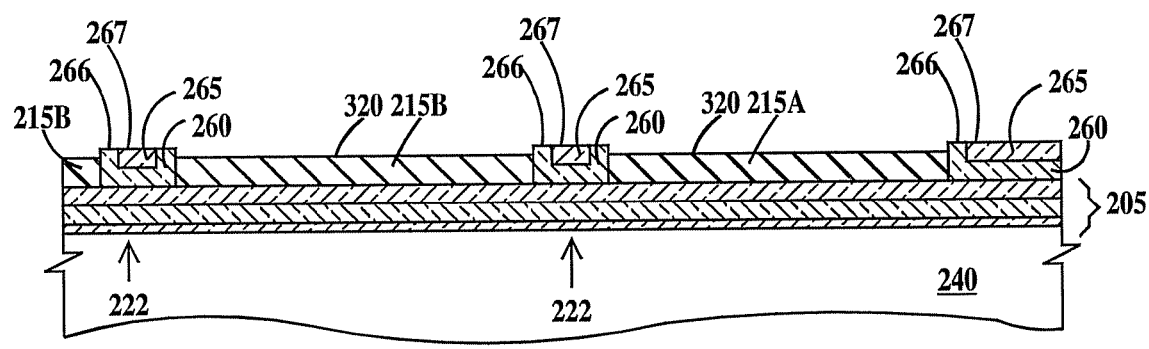
Figure 7E:
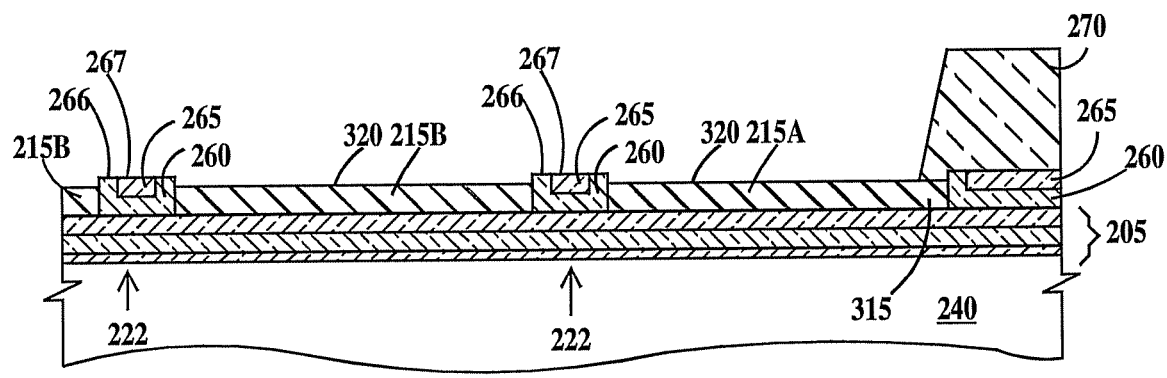

Continuing from FIG. 6E, FIGS. 7A and 7E are partial cross-section views through line 4-4 of FIG. 3, illustrating fabrication of wire bond pads according to fourth, fifth and sixth embodiments of the present invention. In FIG. 7A a chemical-mechanical polish (CMP) process is performed to remove first and second dielectric layers 260 and 265 from over outer wire bond pad 215A and inner wire bond pads 215B, but leave spaces 222 filled with first and second dielectric layers 260 and 265 so top surfaces 266 of first dielectric layer 260 and top surfaces 267 of second dielectric layer 265 are about coplanar with coplanar top surfaces 295 of outer and inner wire bond pads 215A and 215B. Unlike the first three embodiments of the present invention there are no edges of outer wire bond pad 215A and inner wire bond pads 215B that are overlapped or covered by first and second dielectric layers 260 and 265 anywhere on the chip.

Processing may continue to the processes and structures described in relation to FIG. 7B for the fourth embodiment of the present invention or continue to the processes and structures described in relationship to FIG. 7D for the fifth and sixth embodiments of the present invention.

Continuing from FIG. 7A, in FIG. 7B, final dielectric layer 270 is applied to top surfaces 266 of first dielectric layer 260, top surface 267 of second dielectric layer 265 and to top surfaces 295 of outer and inner wire bond pads 215A and 215B and patterned as described supra in relation to FIGS. 6F and 6G. Final dielectric layer 270 is in direct contact with outer wire bond pad 215A over an edge region 315 of the outer wire bond pad. The structure illustrated in FIG. 7B constitutes the fourth embodiment of the present invention. Processing may now terminate or processing may continue to the processes described in reference to either of FIG. 7C or FIG. 7D.

Continuing from FIG. 7B, in FIG. 7C, outer and inner wire bond pads 215A and 215B are recessed so that top surfaces 320 of outer and inner wire bond pads 215A and 215B are below top surfaces 266 of first dielectric layer 260 and top surfaces 267 of second dielectric layer 265 filling spaces 222. The structure illustrated in FIG. 7C constitutes the fifth embodiment of the present invention. Processing now terminates.

Continuing from FIG. 7A, in FIG. 7D, outer and inner wire bond pads 215A and 215B are recessed so that top surfaces 320 of outer and inner wire bond pads 215A and 215B are below top surfaces 266 of first dielectric layer 260 and top surfaces 267 of second dielectric layer 265 filling spaces 222.

In FIG. 7E, final dielectric layer 270 is applied to top surfaces 266 of first dielectric layer 260, top surface 267 of second dielectric layer 265 and to top surfaces 320 of outer and inner wire bond pads 215A and 215B and patterned as described supra in relation to FIGS. 6F and 6G. Dielectric layer 270 is in direct contact with outer wire bond pad 215A over an edge region 315 of the outer wire bond pad. The structure illustrated in FIG. 7E constitutes the sixth embodiment of the present invention. Processing now terminates.

Thus, the present invention provides a high-density wire bond pad structure that offers increased I/O count without sacrificing reliability or impacting productivity.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
an interlevel dielectric layer on a top surface of a substrate;
a plurality of electrically conductive wires in said interlevel dielectric layer, top surfaces of said wires coplanar with a top surface of said interlevel dielectric layer;
a dielectric passivation layer on said interlevel dielectric layer and covering said plurality of electrically conductive wires, a top surface of each wire of said plurality of electrically conductive wires exposed in a respective via opening in said dielectric passivation layer;
a plurality of electrically conductive wire bond pads on said dielectric passivation layer, said wire bond pads spaced apart, each wire bond pad of said plurality of wire bond pads having first and second ends, said first ends of each wire bond pad of said plurality of electrically conductive wire bond pads extending over a respective via opening and contacting a respective wire;
a terminal dielectric passivation layer on said dielectric passivation layer, said terminal dielectric passivation layer filling spaces between adjacent wire bond pads of said plurality of wire bond pads, top surfaces of said terminal dielectric passivation layer in said spaces about coplanar with top surfaces of each wire bond pad of said plurality of wire bond pads, said terminal dielectric passivation layer on top surfaces of and overlapping said first and second ends of each wire bond pad of said plurality of wire bond pads, and said terminal dielectric passivation layer overlapping at least three sides of each wire of said respective wires; and
openings in said terminal dielectric passivation layer, regions of said top surfaces of each wire bond pad of said plurality of wire bond pads exposed between respective first and second ends of each wire bond pad of said plurality of wire bond pads in said openings.

2. The structure of claim 1, further including:
a final dielectric passivation layer on said terminal dielectric passivation layer.

3. The structure of claim 1, wherein at least one of said openings extends across two or more adjacent wire bond pads.

4. The structure of claim 2, wherein said final dielectric passivation layer is polyimide.

5. The structure of claim 1, wherein said terminal dielectric passivation layer comprises a layer of silicon oxide, a layer of silicon nitride or combinations thereof.

6. The structure of claim 1, wherein said terminal dielectric passivation layer comprises a layer of silicon oxide or a layer of silicon nitride.

7. The structure of claim 1, wherein said terminal dielectric passivation layer comprises a first dielectric layer and a second dielectric layer on top of said first dielectric layer, said second dielectric layer in direct contact with regions of top surfaces of each wire bond pad of said plurality of electrically conductive wire bond pads.

8. The structure of claim 7, wherein said first dielectric layer is a layer of silicon oxide and said second dielectric layer is a layer of silicon nitride.

9. The structure of claim 1, wherein said wire bond pads comprise aluminum, aluminum copper alloy, copper, gold, tantalum, tantalum nitride or combinations thereof.

10. The structure of claim 1, wherein said plurality of electrically conductive wire bond pads are arranged in four rows, each row of said four rows of wire bond pads adjacent to a different edge of an integrated circuit chip.

11. A structure, comprising:
an interlevel dielectric layer on a top surface of a substrate;
a plurality of electrically conductive wires in said interlevel dielectric layer, top surfaces of said wires coplanar with a top surface of said interlevel dielectric layer;
a dielectric passivation layer on said interlevel dielectric layer and covering said plurality of electrically conductive wires, a top surface of each wire of said plurality of electrically conductive wires exposed in a respective via opening in said dielectric passivation layer;
a plurality of electrically conductive wire bond pads on said top surface of said dielectric passivation layer, said wire bond pads spaced apart, each wire bond pad of said plurality of wire bond pads having first and second ends, said first ends of each wire bond pad of said plurality of electrically conductive wire bond pads extending over a respective via opening and contacting a respective wire;
a terminal dielectric passivation layer on said dielectric passivation layer, said terminal dielectric passivation layer filling spaces between adjacent wire bond pads of said plurality of wire bond pads, top surfaces of each wire bond pad of said plurality of wire bond pads recessed below a top surfaces of said terminal dielectric passivation layer, said terminal dielectric passivation layer on top surfaces of and overlapping said first and second ends of each wire bond pad of said plurality of wire bond pads, and said terminal dielectric passivation layer overlapping at least three sides of each wire of said respective wires; and
openings in said terminal dielectric passivation layer, regions of said top surfaces of each wire bond pad of said plurality of wire bond pads exposed between respective first and second ends of each wire bond pad of said plurality of wire bond pads in said openings.

12. The structure of claim 11, further including:
a final dielectric passivation layer on said terminal dielectric passivation layer.

13. The structure of claim 11, wherein at least one of said openings extends across two or more adjacent wire bond pads.

14. The structure of claim 12, wherein said final dielectric passivation layer is polyimide.

15. The structure of claim 11, wherein said terminal dielectric passivation layer comprises a layer of silicon oxide, a layer of silicon nitride or combinations thereof.

16. The structure of claim 11, wherein said terminal dielectric passivation layer comprises a layer of silicon oxide or a layer of silicon nitride.

17. The structure of claim 11, wherein said terminal dielectric passivation layer comprises a first dielectric layer and a second dielectric layer on top of said first dielectric layer, said second dielectric layer in direct contact with regions of top surfaces of each wire bond pad of said plurality of electrically conductive wire bond pads.

18. The structure of claim 17, wherein said first dielectric layer is a layer of silicon oxide, a layer of silicon nitride or combinations thereof and said second dielectric comprises polyimide.

19. The structure of claim 11, wherein said wire bond pads comprise aluminum, aluminum copper alloy, copper, gold, tantalum, tantalum nitride or combinations thereof.

20. The structure of claim 11, wherein said plurality of electrically conductive wire bond pads are arranged in four rows, each row of said four rows of wire bond pads adjacent to a different edge of an integrated circuit chip.

\* \* \* \* \*